United States Patent [19]

Song

[11] Patent Number: 5,830,595
[45] Date of Patent: Nov. 3, 1998

[54] BATTERY CAPACITY PREDICTION METHOD AND APPARATUS USING NATURAL LOGARITHM

[75] Inventor: Sung-ku Song, Sungnam, Rep. of Korea

[73] Assignee: Samsung Electronics Co. Ltd., Kyungki-do, Rep. of Korea

[21] Appl. No.: 563,401

[22] Filed: Nov. 30, 1995

[30] Foreign Application Priority Data

Nov. 30, 1994 [KR] Rep. of Korea ................. 94-32127

[51] Int. Cl.$^6$ ............................................. H01M 10/44
[52] U.S. Cl. ................................................. 429/92; 429/91
[58] Field of Search ........................ 429/90, 91, 92, 429/93

[56] References Cited

U.S. PATENT DOCUMENTS 3,886,442  5/1975  Chiku et al. .
4,390,841  6/1983  Martin et al. .
4,558,281  12/1985  Codd et al. ............... 324/433
4,595,880  6/1986  Patil .
4,952,862  8/1990  Biagetti et al. .............. 320/46
5,349,540  9/1994  Birkle et al. ............... 364/578

OTHER PUBLICATIONS

Weast ed. "Handbook of Chemistry and Physics, 53rd edition", Chemical Rubber Company, publisher, pp. A1—A–3 (no month available), 1973.

*Primary Examiner*—Stephen Kalafut
*Assistant Examiner*—Carol Chaney
*Attorney, Agent, or Firm*—Lowe Hauptman Gopstein Gilman & Berner

[57] ABSTRACT

In a method and apparatus for measuring battery state-of-charge, the total available capacity is calculated using natural logarithms. The application of natural logarithm instead of using Peukert's Equation simplifies the method and provides higher accuracy.

12 Claims, 3 Drawing Sheets

BATTERY CAPACITY PREDICTION METHOD AND APPARATUS USING NATURAL LOGARITHM

BACKGROUND OF THE INVENTION

The present invention relates to a battery capacity prediction method and apparatus, and more particularly, to a method and apparatus for predicting the relationship between current and battery capacity by using natural logarithm which can be applied to any battery-powered products.

Generally, there are various types of methods for measuring a battery state-of-charge: i) an open circuit voltage measurement method, ii) an electrolyte specific-gravity measurement method, iii) an internal resistance measurement method, iv) a voltage measurement method at a constant-current discharging time, and v) ampere-hour (or a current accumulation) method. Among these methods, the ampere-hour method is most widely used for electric vehicles. Here, the battery state-of-charge is calculated from dividing the ampere-hours by a preset battery capacity.

The ampere-hour method, however, is susceptible to a high rate of error if the load varies greatly since the available capacity depends on the load condition. The capacity becomes less as the load gets heavier and vice versa. In order to rectify this shortcoming associated with the ampere-hour method, Peukert's Equation is employed as suggested in U.S. Pat. Nos. 3,886,442, 4,390,841 and 4,595,880. Peukert's Equation calculates the available capacity corresponding to the discharge current, and therefore, it can reduce the error considerably.

In order to use Peukert's Equation, Peukert's constants, n and K, must be obtained. The procedure for obtaining n and K is as follows:

$$n \frac{\log \frac{t_2}{t_1}}{\log \frac{I_1}{I_2}}$$

$$K = I_1^n t_1 = I_2^n t_2$$

where $I_1$ is a current value which will discharge the battery completely in 0.5 hours (i.e. 2C rate) and $I_2$ is a current value which will discharge the battery completely in 5 hours (i.e. C/5 rate), and $t_1$ and $t_2$ are discharge times at $I_1$ and $I_2$, respectively.

Referring to FIG. 1, in step 11, the instantaneous discharge current (I(t)) of a battery is measured and read, and in step 12, the average discharge current ($I_d$) is calculated. In step 13, the total ampere-hour used (Ah_Used) is calculated, and in step 14, the available capacity (Ah_Available) is calculated by applying Peukert's Equation. Finally, in step 15, the state-of charge of the battery is calculated and the process returns to step 11.

This method works well if the average discharge current ($I_d$) is close to either $I_1$ or $I_2$. However, if $I_d$ is far away from either $I_1$ or $I_2$, the accuracy is reduced as shown in TABLE A below.

SUMMARY OF THE INVENTION

To overcome the above problems, it is an object of the present invention to provide a battery capacity prediction method and apparatus for indicating the relationship between discharge current and battery capacity using an algorithm based on natural logarithm.

Accordingly, to achieve the above object, there is provide a battery capacity prediction method according to the discharge current using natural logarithm.

According to the invention, the available capacity (Ah_Available) is calculated as $$Ah\_Available = a[\ln(I_d)] + b$$

wherein $I_d$ is the average discharge current, and a and b are constants obtained from experimental results as follows:

$$a = \frac{Cap_1 - Cap_2}{\ln(I_1) - \ln(I_2)};$$

and $$b = Cap_1 - a\ln(I_1) = Cap_2 - a\ln(I_2)$$

where $I_1$ is a current value which will discharge the battery completely in 0.5 hours (i.e. 2C rate) and $I_2$ is a current value which will discharge the battery completely in 5 hours (i.e. C/5 rate) , and $Cap_1$ and $Cap_2$ are ampere-hour (Ah) capacities at $I_1$ and $I_2$, respectively.

The method for calculating the state-of-charge according to the invention is shown in FIG. 2.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
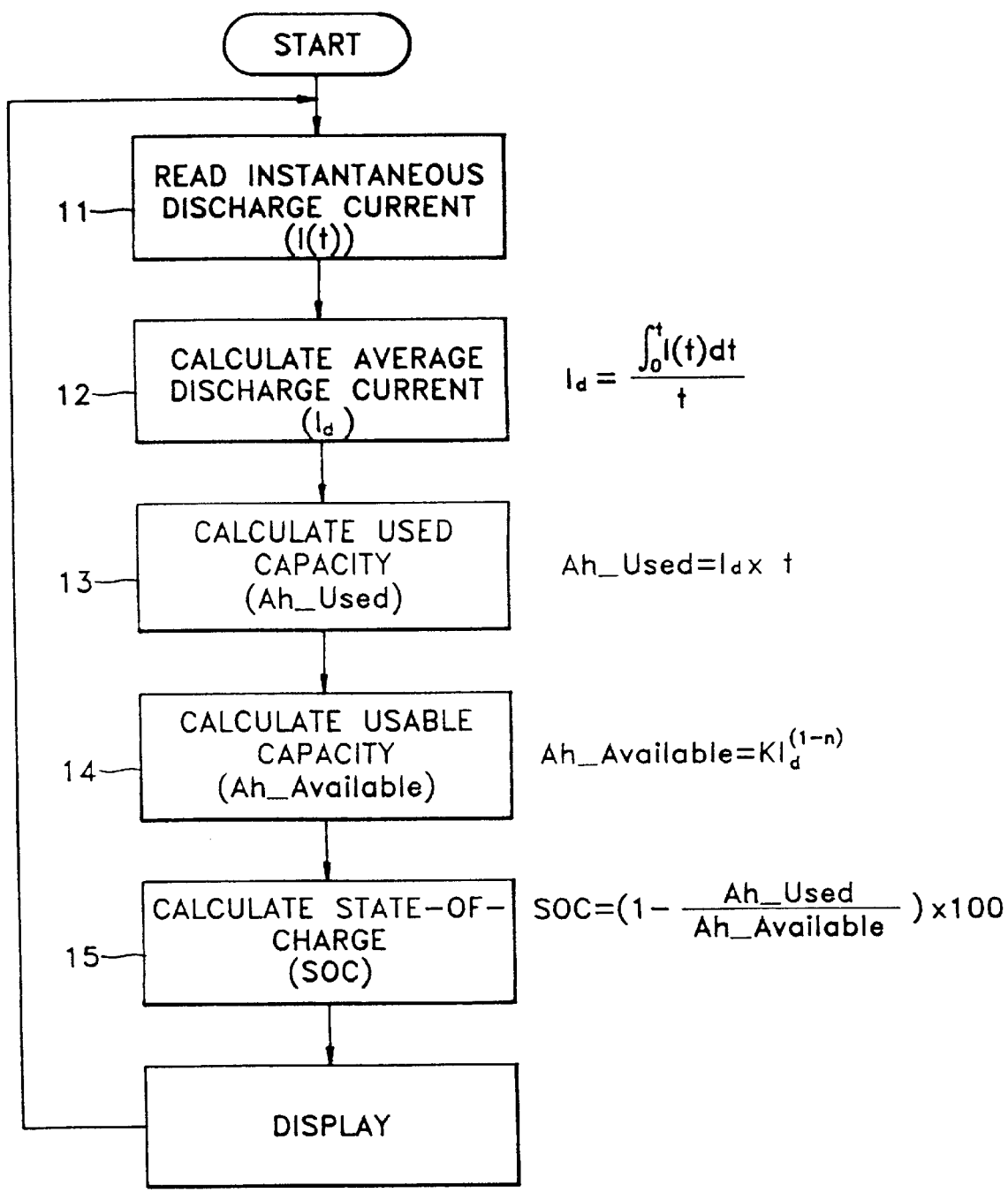
FIG. 1 is a flowchart for illustrating the battery capacity prediction method using Peukert's Equation in accordance with the prior art.
Figure 2:
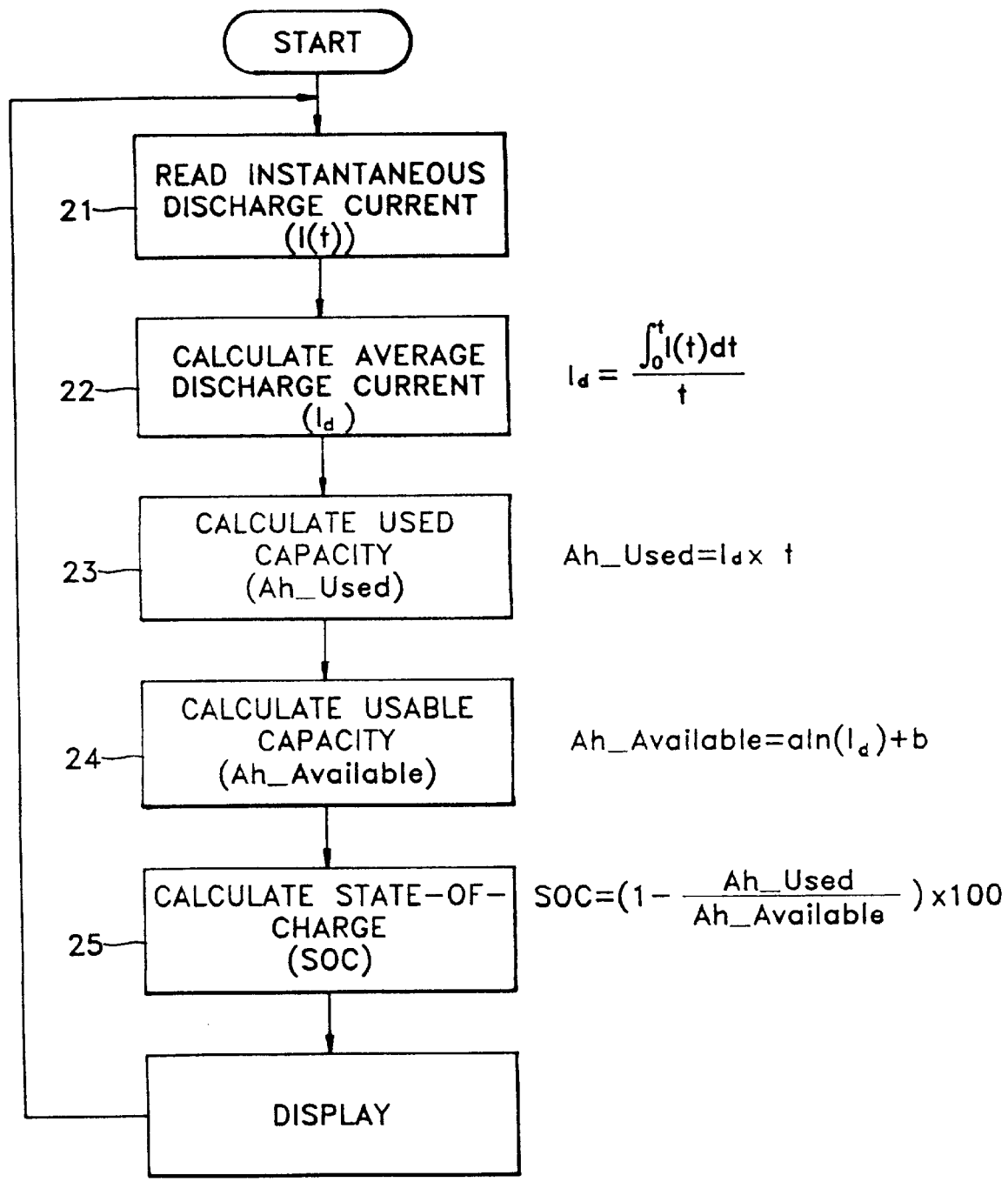
FIG. 2 is a flowchart for illustrating the battery capacity prediction method according to the present invention.

FIG. 2 is a flowchart for explaining a battery capacity predicting method according to the discharge current using a natural logarithm according to the present invention.

In general, in using Peukert's Equation, Peukert's constants K and n are obtained by discharging a battery by more than two constant currents. However, in using a natural logarithm, the following equation (1) is obtained from the battery discharging result so as to replace the Peukert's constants K and n.

$$Ah\_Available = a[\ln(I_d)] + b \qquad (1)$$

wherein a and b are constants obtained from experimental results as follows:

$$a = \frac{Cap_1 - Cap_2}{\ln(I_1) - \ln(I_2)};$$

and $$b = Cap_1 - a\ln(I_1) = Cap_2 - a\ln(I_2)$$

where $I_1$ is a current value which will discharge the battery completely in 0.5 hours (i.e. 2C rate) and $I_2$ is a current value which will discharge the battery completely in 5 hours (i.e. C/5 rate), and $Cap_1$ and $Cap_2$ are ampere-hour (Ah) capacities at $I_1$ and $I_2$, respectively.

Referring to FIG. 2, in step 21, the instantaneous discharge current (I(t)) is measured and read. In step 22, the average discharge current ($I_d$) is calculated. In step 23, the total ampere-hour used capacity (Ah_Used) is calculated. In step 24, the usable capacity (Ah_Available) is calculated by applying natural logarithm as in expression (1). Finally, in step 25, the state-of-charge of the battery is calculated and the process returns to step 21.

The relationship between discharge current and capacity is shown in TABLE A below. It can be seen, by comparing the fifth and seventh columns, that natural logarithm method is superior to Peukert's Equation method. Furthermore, the procedure for obtaining the constants for natural logarithm involves much simpler calculation than the constants for Peukert's Equation.

<TABLE A>

| Discharge Current (A) | Discharge Time (hr) | Experimental Capacity (Ah) | Capacity using Peukert's Equation (Ah) | Error (%) | Capacity using Natural Logarithm (Ah) | Error (%) |
|---|---|---|---|---|---|---|
| 5 | 10.06 | 50.3 | 55.6 | 10.6 | 53.1 | 5.6 |
| 10 | 4.71 | 47.1 | 47.1 | 0.0 | 47.1 | 0.0 |
| 20 | 2.11 | 42.2 | 39.9 | 5.5 | 41.1 | 2.7 |
| 40 | 0.9 | 35.9 | 33.8 | 5.9 | 35.1 | 2.3 |
| 60 | 0.53 | 31.8 | 30.6 | 3.7 | 31.5 | 0.8 |
| 80 | 0.37 | 29.2 | 28.6 | 2.1 | 29.0 | 0.6 |
| 100 | 0.27 | 27.1 | 27.1 | 0.0 | 27.1 | 0.0 |
| 120 | 0.22 | 25.9 | 25.9 | 0.1 | 25.5 | 1.6 |
| 160 | 0.15 | 23.4 | 24.2 | 3.6 | 23.0 | 1.5 |
| 200 | 0.11 | 21.8 | 22.9 | 5.3 | 21.1 | 3.3 |

The battery capacity prediction method of the present invention can be applied to any battery-powered products from an electric vehicles to portable electric vehicle (e.g. forklift or golf cart).

Figure 3:
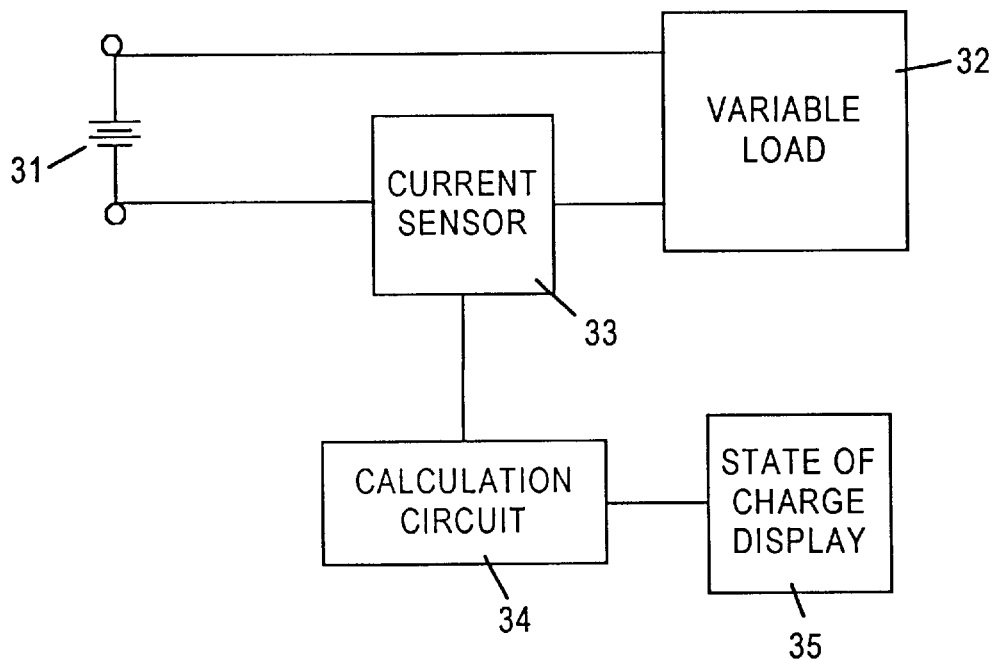
FIG. 3 is a circuit for practicing the method illustrated in FIG. 2.

FIG. 3 is a block diagram including a battery 31, a variable load 32, a current sensor 33, a calculation circuit, and a state of charge display 35. The calculation circuit 34 may be a microprocessor or a dedicated circuit and is programmed to calculate the state-of-charge in accordance with the flowchart of FIG. 2.

As described above, in the battery capacity prediction method and apparatus according to the present invention, the usable battery capacity according to the current in use is predicted by using natural logarithm. Therefore, the method is simplified and the prediction accuracy is enhanced.

What is claimed is:

1. A method to determine a state-of-charge of a battery using a logarithmic relationship between the total available capacity of the battery (Ah_Available) and an average discharge current of the battery, comprising the steps of:

reading, by an electrical circuit, an instantaneous discharge current of a battery whose state-of-charge is to be determined;

calculating, using the electrical circuit, a total available capacity of the battery from the formula:

$$\text{Ah\_Available} = a\{\ln(I_d)\} + b$$

wherein $I_d$ is the average discharge current, and a and b are constants obtained from experimental results as follows:

$$a = \frac{Cap_1 - Cap_2}{\ln(I_1) - \ln(I_2)};$$

and $$b = Cap_1 - a\ln(I_1) = Cap_2 - a\ln(I_2)$$

where $I_1$ is a current value which will discharge the battery completely in 0.5 hours, $I_2$ is a current value which will discharge the battery completely in 5 hours, and $Cap_1$ and $Cap_2$ are ampere-hour capacities at $I_1$ and $I_2$, respectively;

calculating, using the electrical circuit, a used capacity of the battery from the formula:

$$\text{Ah\_Used} = I_1 \times t$$

calculating using the electrical circuit, the state-of-charge of the battery from the formula:

$$SOC = \left(1 - \frac{Ah\ \text{Used}}{Ah\ \text{Available}}\right) \times 100;$$

and displaying the state-of-charge of the battery on a display.

2. A method according to claim 1, wherein said calculating the state-of-charge of the battery is repeated as long as the battery is being used.

3. A method to determine a state-of-charge of a battery using logarithmic relationship between the total available capacity of the battery (Ah_Available) and an average discharge current of the battery, comprising:

measuring an instantaneous discharge current (I(t)) of the battery;

calculating, by using an electrical circuit, an average discharge current ($I_d$) from I(t) from the formula:

$$I_d = \frac{\int_0^t I(t)dt}{t}$$

calculating, using the electrical circuit, a used capacity (Ah_Used) of the battery from the formula:

$$\text{Ah Used} = I_d \times t$$

experimentally determining constants a and b using the electrical circuit in accordance with the formulas:

$$a = \frac{Cap_1 - Cap_2}{\ln(I_1) - \ln(I_2)};$$

and $$b = Cap_1 - a\ln(I_1) = Cap_2 - a\ln(I_2)$$

where $I_1$ is a current value which will discharge the battery completely in 0.5 hours, $I_2$ is a current value which will discharge the battery completely in 5 hours, and $Cap_1$ and $Caps_2$ are ampere-hour (AH) capacities at $I_1$ and $I_2$, respectively;

calculating, by the circuit, the available capacity of the battery from the formula $$\text{Ah\_Available} \times a\{\ln(I_d)\} + b$$

wherein $I_d$ is the average discharge current, and a and b are the constants calculated in said calculating step; and calculating, using the circuit, the state of charge of the battery from the formula $$SOC = \left(1 - \frac{Ah\ \text{Used}}{Ah\ \text{Available}}\right) \times 100;$$

and displaying the state-of-charge of the battery on a display.

4. A method to determine a state-of-charge of a battery using a logarithmic relationship between the total available capacity of the battery and an average discharge current of the battery, comprising:
   a) measuring an instantaneous discharge current of the battery;
   b) calculating, using a circuit, an average discharge current ($I_1$) over time by using said measured instantaneous discharge current;
   c) calculating, using the electrical circuit, a total ampere-hour used capacity (Ah_Used) using said average discharge current;
   d) calculating, using the electrical circuit, an available ampere-hour capacity (Ah_Available) using a natural logarithm of the average discharge current;
   e) calculating, using the circuit, the state-of-charge of the battery using the calculated values of Ah_Used and Ah_Available; and
   f) displaying the state-of-charge of the battery calculated in said step e) on a display.

5. The method of claim 4, wherein step d) is performed according to the following formula:

Ah_Available=$a[\ln(I_d)]+b$ wherein a and b are constants obtained from experimental results as follows:

$$a = \frac{Cap_1 - Cap_2}{\ln(I_1) - \ln(I_2)}\ ;$$

and $b = Cap_1 - a\ln(I_1) = Cap_2 - a\ln(I_2)$; and where $I_1$ is a current value which will discharge the battery completely in 0.5 hours, $I_2$ is a current value which will discharge the battery completely in 5 hours, and $Cap_1$ and $Cap_2$ are ampere-hour (AH) capacities at $I_1$ and $I_2$.

6. The method of claim 4, wherein steps a) through e) are continuously repeated as long as the battery is being used.

7. An apparatus for predicting the usable capacity of a battery, comprising:
   input means for receiving a measured instantaneous discharge current of the battery; and
   a calculation circuit responsive to the instantaneous discharge current and programmed to predict the usable capacity of the battery by:
      calculating an average discharge current ($I_d$) over time by using said measured instantaneous discharge current,
      calculating a total ampere-hour used capacity (Ah_Used) by using said average discharge current,
      calculating an available ampere-hour capacity (Ah_Available) by using a natural logarithm, and
      calculating a state-of-charge of the battery using the calculated values of Ah_Used and Ah_Available; and
   output means for providing a signal representing the state-of-charge.

8. The apparatus of claim 7, wherein said calculation circuit calculates the available ampere-hour capacity according to the following formula:

Ah_Available=$a\{\ln(I_d)\}+b$ wherein a and b are constants obtained from experimental results as follows;

$$a = \frac{Cap_1 - Cap_2}{\ln(I_1) - \ln(I_2)}\ ;$$

and $b = Cap_1 - a\ln(I_1) = Cap_2 - a\ln(I_2)$ where $I_1$ is a current value which will discharge the battery completely in 0.5 hours, $I_2$ is a current value which will discharge the battery completely in 5 hours, and $Cap_1$ and $Cap_2$ are ampere-hour (AH) capacities at $I_1$ and $I_2$.

9. The apparatus according to claim 7, further comprising:
   a display device coupled to said output means for displaying the state-of-charge.

10. A method for determining and displaying a state-of-charge of a battery, comprising:
    a) measuring an instantaneous discharge current of the battery;
    b) calculating an average discharge current ($I_d$) over time by using said measured instantaneous discharge current;
    c) calculating a total ampere-hour used capacity (Ah_Used) by using said average discharge current;
    d) calculating an available ampere-hour capacity (Ah_Available) responsive to a natural logarithm of the average discharge current;
    e) calculating the state-of-charge of the battery using the calculated values of Ah_Used and Ah_Available; and
    f) displaying the state-of-charge calculated in said step e) on a display.

11. A method for determining and displaying a state-of-charge of a battery, comprising:
    a) calculating a total ampere-hour used capacity (Ah_Used) responsive to an average discharge current;
    b) calculating an available ampere-hour capacity (Ah_Available) responsive to a natural logarithm of the average discharge current;
    c) calculating the state-of-charge of the battery responsive to the Ah_Used and the Ah_Available; and
    d) displaying the state-of-charge calculated in said step c) on a display.

12. A battery capacity prediction and displaying method comprising the steps of:
    reading, by reading means, an instantaneous discharge current of a battery whose state-of-charge is to be measured;
    calculating, by calculating means, a total available capacity of the battery by Ah_Available=$a\{\ln(I_d)\}+b$ wherein $I_d$ is the average discharge current, and a and b are constants obtained from experimental results as follows:

$$a = \frac{Cap_1 - Cap_2}{\ln(I_1) - \ln(I_2)}\ ;$$

and $$b = Cap_1 - a\ln(I_1) = Cap_2 - a\ln(I_2)$$

where $I_1$ is a current value which will discharge the battery completely in 0.5 hours, $I_2$ is a current value which will discharge the battery completely in 5 hours, and $Cap_1$ and $Cap_1$ are ampere-hour capacities at $I_1$ and $I_2$, respectively; and calculating, by the calculating means, the total capacity used from the formula:

$$Ah\_used = I_d \times t$$

calculating, by the calculating means, the state-of-charge of the battery from the formula:

$$SOC = \left(1 - \frac{Ah\ \text{Used}}{Ah\ \text{Available}}\right) \times 100;$$

and displaying the state-of-charge of the battery on a display.

* * * * *